United States Patent
Kadosh et al.

(10) Patent No.: US 6,218,251 B1
(45) Date of Patent: Apr. 17, 2001

(54) ASYMMETRICAL IGFET DEVICES WITH SPACERS FORMED BY HDP TECHNIQUES

(75) Inventors: Daniel Kadosh, Austin; Mark I. Gardner, Cedar Creek, both of TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/187,894

(22) Filed: Nov. 6, 1998

(51) Int. Cl.[7] .................. H01L 21/336; H01L 21/311
(52) U.S. Cl. .................. 438/303; 438/286; 438/696
(58) Field of Search ................... 438/230, 303, 438/696, 231, 286, 287, 302

(56) References Cited

U.S. PATENT DOCUMENTS

| | | | | |
|---|---|---|---|---|
| 4,536,640 | * | 8/1985 | Vukanovic | 219/121 |
| 5,043,294 | * | 8/1991 | Willer et al. | 437/39 |
| 5,177,570 | * | 1/1993 | Tanaka | 257/345 |
| 5,494,854 | | 2/1996 | Jain | 437/195 |
| 5,532,175 | * | 7/1996 | Racanelli et al. | 437/26 |
| 5,541,436 | | 7/1996 | Kwong et al. | 257/410 |
| 5,600,165 | * | 2/1997 | Tsukamoto et al. | 257/323 |
| 5,621,241 | | 4/1997 | Jain | 257/632 |
| 5,641,546 | | 6/1997 | Elwell et al. | 427/565 |
| 5,670,828 | | 9/1997 | Cheung et al. | 257/773 |
| 5,672,531 | * | 9/1997 | Gardner et al. | 437/44 |
| 5,674,788 | | 10/1997 | Wristers et al. | 437/239 |
| 5,679,606 | | 10/1997 | Wang et al. | 437/195 |
| 5,683,548 | | 11/1997 | Hartig et al. | 156/643.1 |
| 5,686,356 | | 11/1997 | Jain et al. | 437/195 |
| 5,728,621 | | 3/1998 | Zheng et al. | 438/427 |
| 5,732,241 | | 3/1998 | Jang et al. | 438/424 |
| 5,759,897 | * | 6/1998 | Kadosh et al. | 438/286 |
| 5,783,457 | * | 7/1998 | Hsu | 437/35 |
| 5,851,893 | * | 12/1998 | Gardner et al. | 438/305 |
| 5,956,612 | * | 9/1999 | Elliott et al. | 438/637 |
| 6,004,852 | * | 12/1999 | Yeh et al. | 438/303 |
| 6,005,807 | * | 12/1999 | Chen | 365/185.26 |
| 6,046,089 | * | 4/2000 | Gardner et al. | 438/303 |

OTHER PUBLICATIONS

S. Kusunoki et al, "Hot–Carrier–Resistant Structure by Re–Oxidized Nitrided Oxide Sidewall for Highly Reliable and High Performance LDD MOSFETS," LSI Laboratory, Mitsubishi Electric Corporation, Japan, International Electron Devices Meeting, Washington, DC, Dec. 8–11, 1991 (5 pages).

Stanley Wolf, "Silicon Processing for the VLSI Era, vol. 3: The Submicron MOSFET," Lattice Press, Sunset Beach, California, 1995 (26 pages).

* cited by examiner

Primary Examiner—Richard Elms
Assistant Examiner—Adam Pyonin
(74) Attorney, Agent, or Firm—Skjerven Morrill MacPherson LLP; John A. Odozynski

(57) ABSTRACT

In an IGFET device having at least one source/drain region with a lightly-doped sub-region proximate a channel region, the source/drain regions are formed by first implanting ions with parameters to form lightly-doped source/drain regions. A high density plasma deposition provides at least one spacer having preselected characteristics. As a result of the spacer characteristics, an ion implantation with parameters to form normally-doped source/drain regions is shadowed by the spacer. A portion of the source/drain region shadowed by the spacer results in a lightly-doped source/drain sub-region proximate the channel region. According to a second embodiment of the invention, the ion implantation resulting in the lightly-doped source/drain regions is eliminated. Instead, the spacer(s) formed by the high density plasma deposition and subsequent etching process only partially shadows the ion implantation that would otherwise result in normal doping of the source/drain regions. The parameters of the spacer(s) resulting from the high density plasma deposition and subsequent etching process result in a lightly-doped source/drain sub-region proximate the channel region. The shadowing of the spacer decreases with distance from the gate structure and results in a normal doping level for the portion of the source/drain terminal not shadowed by the spacer.

24 Claims, 5 Drawing Sheets

ASYMMETRICAL IGFET DEVICES WITH SPACERS FORMED BY HDP TECHNIQUES

CROSS-REFERENCE TO RELATED APPLICATIONS

This application is related to copending, commonly assigned, concurrently filed U.S. patent application Ser. No. 09/187,258 filed Nov. 6, 1998, which names Mark I. Gardner and Mark C. Gilmer as inventors and is entitled "High Density MOSFET Fabrication Method With Integrated Device Scaling."

This application is related to copending, commonly assigned, concurrently filed U.S. patent application Ser. No. 09/188,085 filed on Nov. 6, 1998, which names Mark I. Gardner, Fredrick N. Hause, and Michael P. Duane as inventors and is entitled "Mask For Asymmetric Transistor Formation With Paired Transistors."

BACKGROUND OF THE INVENTION

1. Field of the Invention

This invention relates generally to the fabrication of integrated circuits and, more particularly to the fabrication of insulated gate, field effect transistor (IGFET) devices. This invention is related specifically to (IGFET) devices that have source/drain regions having two sub-regions, each sub-region with a different doping level.

2. Description of the Related Art

An insulated gate, field effect transistor (IGFET) device 5, such as a metal-oxide semiconductor field-effect transistor (MOSFET) is shown in FIG. 1. A substrate 10 has a doped well region 12, a p-doped well region that will be used for purposes of illustration. The substrate 10 has a p-doped channel region 14 that provides a conducting path between the n-doped source/drain region 16A, 16B and the n-doped source/drain region 18A, 18B. In addition, a p-doped punch-through region 20, is provided below the channel region 14. Also formed in the substrate 10 are the isolation structures 22 and 24. The gate structure of the IGFET device 5 includes a gate dielectric 26, directly over the channel region 20, and a gate electrode 28 over the gate dielectric 26. The gate structure 26, 28 can include spacers 30, 32 formed against the walls of the gate structure 26,28. An insulating layer 34 covers the substrate 10 and the gate structure 26, 28. The insulating layer 34 has vias formed therein and the vias are filled with a conducting material. The conducting material provides conducting vias 36 to source/drain (electrode) regions 16A, 16B and 18A and 18B and to the gate electrode 28. An insulating layer 38, formed over insulating layer 34, is patterned and the portions removed as a result of the patterning are filled with conducting material to provide conducting paths 40. The conducting paths 40 and the remaining insulating material 38 forman interconnect layer providing the electrical coupling between the IGFET device 5 and the remainder of the integrated circuit.

The operation of the IGFET device 5 can be understood as follows. A voltage applied to the gate electrode 28 causes a transverse field in the channel region 14. The transverse field controls (e.g., modulates) the current flow between source/drain region 16A, 16B and source/drain region 18A, 18B. The punch-through region 20 is formed to prevent parasitic effects that can occur when this region is not formed in the device 5. The spacers 30, 32 and the dual-structured, doped source/drain regions 16A, 16B and 18A, 18B address a problem generally referred to as the "hot-carrier" effect. When only one source/drain region 16A and 18A is present and is formed by doping technique aligned with the electrode structure 26,28, charge carriers from these regions can migrate into the channel region 14 and be trapped by the gate dielectric 26. These trapped charge carriers adversely affect the transverse electric field normally formed in the channel region 14 by a voltage applied to the gate electrode 28. The problem is alleviated by lightly-doping source/drain regions 16A and 18A using a technique which aligns this doping procedure with the gate structure 26, 28. Spacers 30 and 32 are next formed on the walls of the gate structure 26, 28. Source/drain regions 16B and 18B are formed by a doping procedure, resulting in source/drain doping concentrations at normal levels, that aligns the source/drain regions 16B and 18B with the spacers 30 and 32, respectively. (While this two-level doping procedure effectively eliminates the "hot-carrier" problem, the resistance between the two source/drain dual regions 16A, 16B and 18A, 18B is increased.) The isolation structures 22, 24 provide electrical insulation between the device 5 and other areas of the integrated circuit.

In providing the spacers that are used in the fabrication of the two lightly-doped source/drain sub-regions, one representative technique is to use a thick layer of silicon oxide covering the exposed surfaces of the substrate and the gate structure. A greater thickness of silicon oxide will accumulate in a comer region where the gate structure is in contact with the substrate. Thus, when an isotropic etch procedure is performed, the gate structure and the surface of substrate can be exposed while leaving a comer region of silicon oxide, generally referred to as a spacer. This spacer has the ability to prevent the penetration of ions into the substrate and can therefore be used to maintain lightly-doped source/drain regions in the vicinity of the channel regions. However, this procedure has problems associated therewith. Both the rate of formation of the silicon oxide material and the etching rate can be uncertain. This uncertainty can result in spacers having unacceptable thickness or unacceptable geometry. The undesirable properties of the spacers can result in a compromise of the structure of the two regions forming each source/drain region and ultimately in the operation of the device.

SUMMARY OF THE INVENTION

A need has therefore been felt for a technique for the fabrication of IGFET devices which includes the feature that the properties of the spacers can be reproducibly controlled. In addition, a need has been felt for a technique for the fabrication of the devices having the feature that spacers can be formed in a manner that eliminates the need for a two-stage ion implantation process to provide source/drain regions having a lightly-doped sub-region.

The aforementioned and other features are accomplished, according to the present invention, by using, in the fabrication of an IGFET device, a high density plasma (HDP) deposition for the formation of the spacers. The parameters of the high density plasma deposition are sufficiently reproducible so that the geometry and the thickness of the spacers can be determined. Thus, after implantation of the lightly-doped regions aligned with the gate structure, the high density plasma deposition can provide spacers on the wall of the gate structure, which, during the implantation of ions to form the normally-doped source/drain regions, will maintain the integrity of the lightly-doped source/drain region in the vicinity of the channel region. In addition, a device with asymmetrical source/drain regions can be fabricated by forming a mask over a comer region of the gate structure and the substrate. This mask will prevent the formation of a spacer that would normally be associated with one of the device's source/drain regions. During the second source/drain ion implantation, one of the sub-regions doped by the second source/drain ion implantation will be aligned with the spacer while the second source/drain region will be aligned with the gate structure. Because of the controllable parameters of the high density plasma, the spacers formed by this technique can be used to permit the fabrication of an IGFET device with a source/drain region having a lightly-doped portion using a single ion implantation step. The spacer formed using the high density plasma technique will attenuate the normal implantation of ions in such a manner that the source/drain region proximate the channel region will receive the equivalent of an ion implantation doping level used for the lightly-doped source/drain regions.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 1:
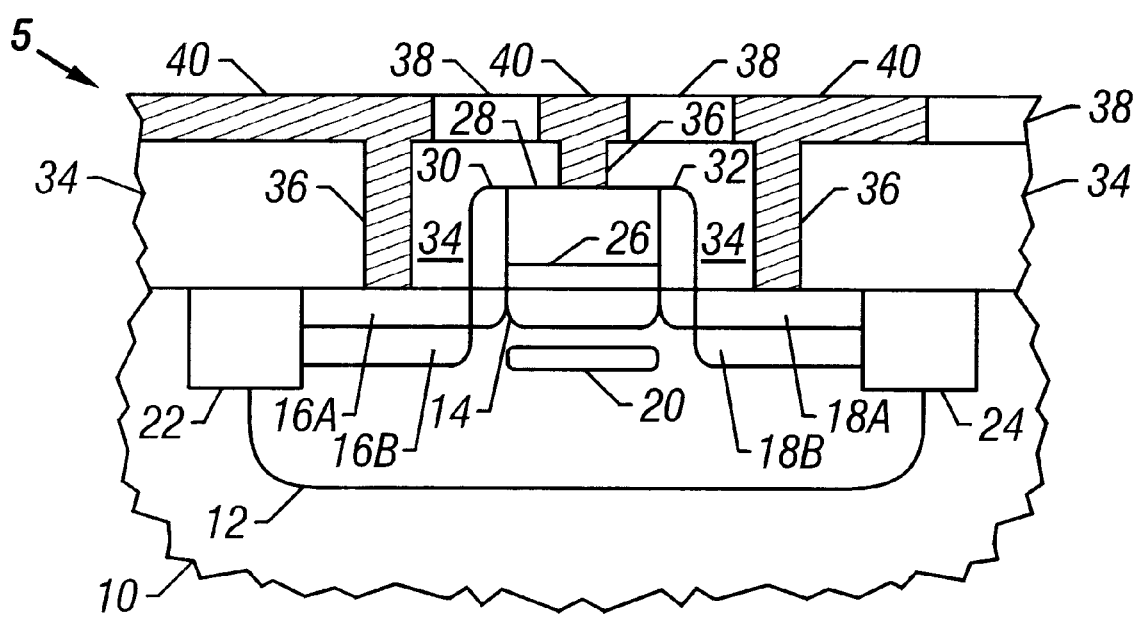
FIG. 1 is a cross-sectional view of a IGFET device according to the related art.

FIG. 1 has been discussed with respect to the related art.

Figure 2A:
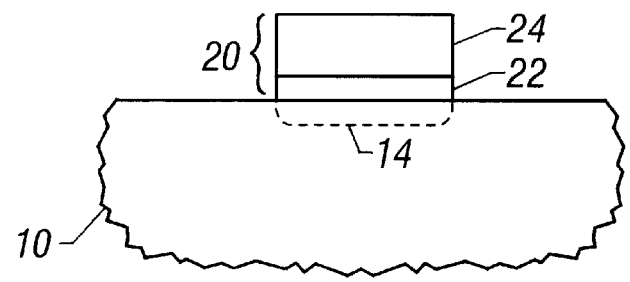
FIGS. 2A–2I illustrate the steps in fabricating an IGFET device with lightly-doped source/drain sub-regions according to the present invention.

Referring to FIG. 2A, the substrate 10 has a well region (not shown), a punch-through region (not shown), and a channel region 14 formed therein. The channel region 14 can be doped with arsenic ions or phosphorous ions to form an n-doped channel region, an n-doped punch-through region, and an n-doped well region; or can be doped with boron to form a p-doped channel region, a p-doped punch-through region, and a p-doped well region. (For the doping of the source/drain regions, the doping ions are reversed from those forming these regions in the substrate 10.) In order to implant the ions at the desired doping concentration and depth levels, phosphorous is implanted to form a channel region with an approximate energy of 15 to 150 keV with a total ion density of approximately $1 \times 10^{12}$ to $1 \times 10^{13}$ ions/$cm^2$; is implanted to form a punch-through region with an approximate energy of 75 to 225 keV with a total ion density of approximately $1 \times 10^{12}$ to $1 \times 10^{13}$ ions/$cm^2$, and is implanted to form a well region with an approximate energy of 150 to 600 keV at a total ion density of approximately $1 \times 10^{12}$ to $1 \times 10^{13}$ ions/$cm^2$. To implant ions at the desired doping concentrations and depth levels, boron is implanted to form a channel region with an approximate energy of 5 to 50 keV at a total doping density of approximately $1 \times 10^{12}$ to $1 \times 10^{13}$ ions/$cm^2$, is implanted to form a punch-through region with an approximate energy of 25 to 75 keV at a total concentration of approximately $1 \times 10^{12}$ to $1 \times 10^{13}$ ions/$cm^2$, and is implanted with an approximate energy of 50 to 200 keV at a total concentration of approximately $1 \times 1^{12}$ to $1 \times 10^{13}$ ions/$cm^2$ to form a well region. A gate dielectric layer 22 (e.g. silicon oxide, silicon nitride, silicon oxynitride, etc.) of 10–30 Å and a gate electrode layer 24 (typically polysilicon, but can be another conducting material) of 1200 to 2000 Å are formed on the substrate 10. The gate dielectric layer 22 and the gate electrode layer 24 are patterned to form gate structure 20.

Figure 2B:
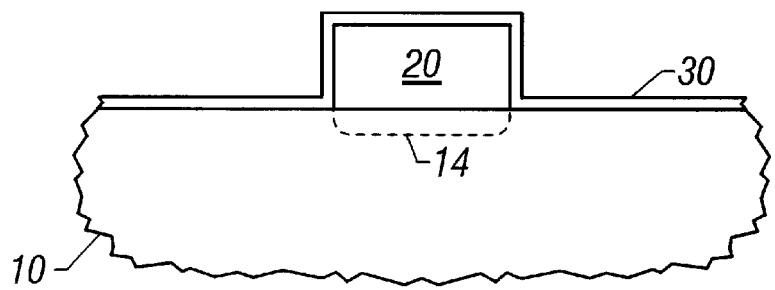

In FIG. 2B a thin nitrogen-rich silicon oxide protective layer 30 is formed over the gate structure 20 and the substrate 10. Protective layer 30 is to prevent damage from ultra-violet radiation during the high-density plasma procedures.)

Figure 2C:
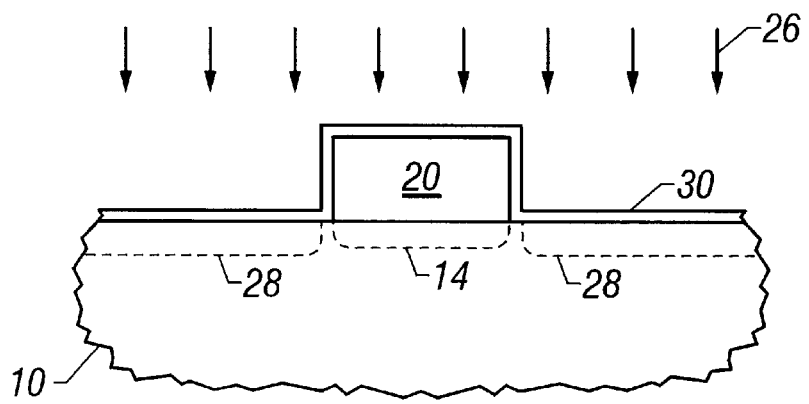

Referring to FIG. 2C, an ion implantation 26 is used to provide lightly-doped source/drain regions 28 aligned by the gate structure 20 (along with the protective layer 30). The lightly-doped regions are formed by the implantation of ions having the opposite polarity of those ions forming the channel region. The ions are implanted at an energy of 5 to 50 keV with a concentration of $1 \times 10^{13}$ to $5 \times 10^{14}$ ions/$cm^2$. The device is then annealed to bring the lightly-doped source/drain regions 28 into contact with the channel region 14.

Figure 2D:
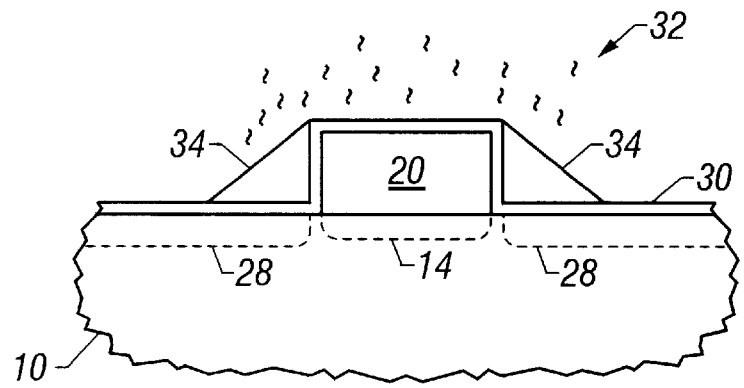

Referring to FIG. 2D, the device has oxide spacers 34 formed by a high density plasma deposition 32. The high density plasma deposition results in a roughly triangular spacer formed on the protective layer 30. The triangular spacers 34 are formed on the sides of gate structure 20 and on the surface of the substrate 10.

Figure 2E:
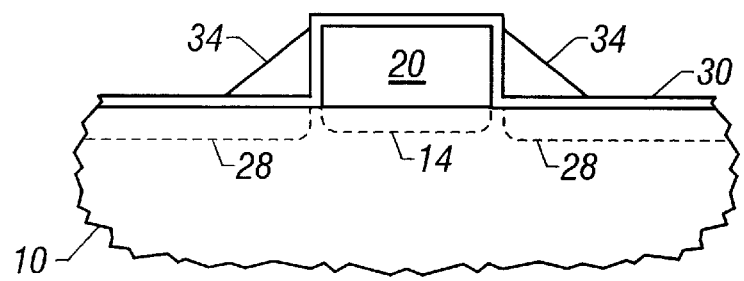

In FIG. 2E, the device is subjected to a timed spacer etch back. During the etch back procedure, in addition to removing oxide material not part of the spacers 34, the spacers 34 have material removed therefrom. However, the generally triangular shape of the spacers 34 is maintained during the etching procedure. The size of the spacers 34 is determined by the length of time of the exposure to the etchant.

Figure 2F:
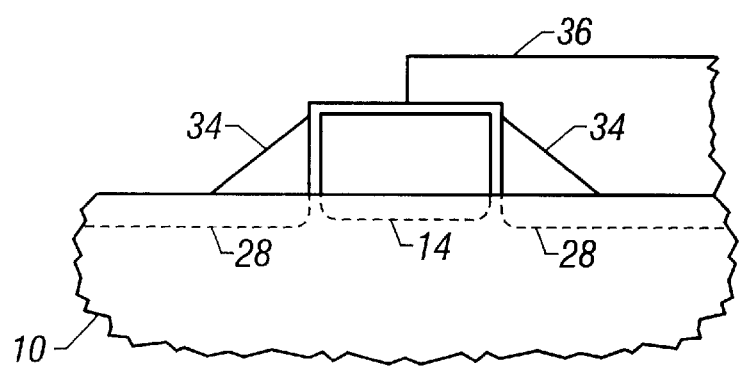

Referring to FIG. 2F, a photoresist layer 36 is applied to the exposed surface of the device. The photoresist layer 36 is patterned to provide a mask protecting one of the two spacers associated with the device.

Figure 2G:
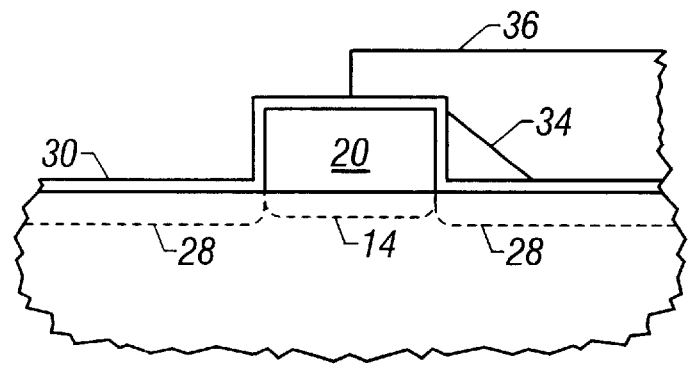

An oxide etch is perfumed on the device and, as indicated by FIG. 2G, the spacer 34 not protected by the photoresist mask 36, is removed.

Figure 2H:
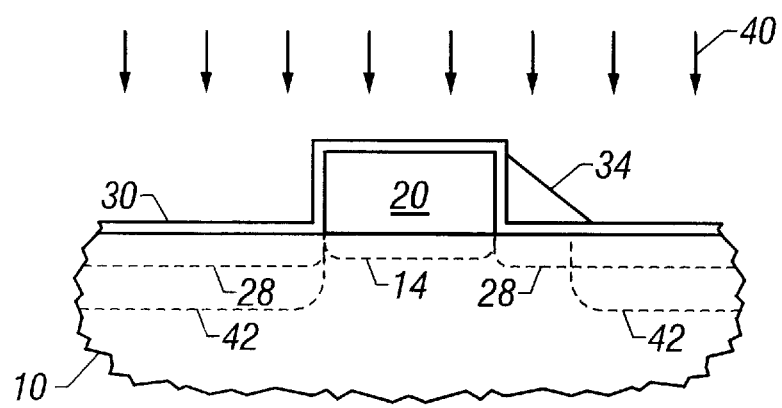

In FIG. 2H, the photoresist layer 36 is removed. Then the device is subjected to an ion implantation 40 to form normally-doped source/drain regions 42. The ion implantation 40 to form normally-doped regions has an energy of 5 to 50 keV at a concentration of $1 \times 10^{15}$ to $5 \times 10^{15}$ ions/$cm^2$. In the source/region not shadowed by a spacer 34, the ion implantation provides a normally doped source/drain region 28 that extends to the channel region 14. This source/drain region merges with the lightly-doped source/drain region that had been previously implanted. With respect to the source /drain region shadowed by the remaining spacer 34, the portion of the source/drain region not shadowed merges with the lightly-doped source/drain region to become a normally-doped source/drain region 42. As the channel region 14 is approached, the shadowing effect of the spacer 34 increases. At some point, the spacer 34 completely masks the impinging ions, and the portion of the source/drain region near the channel region 14 remains lightly-doped.

Figure 2I:
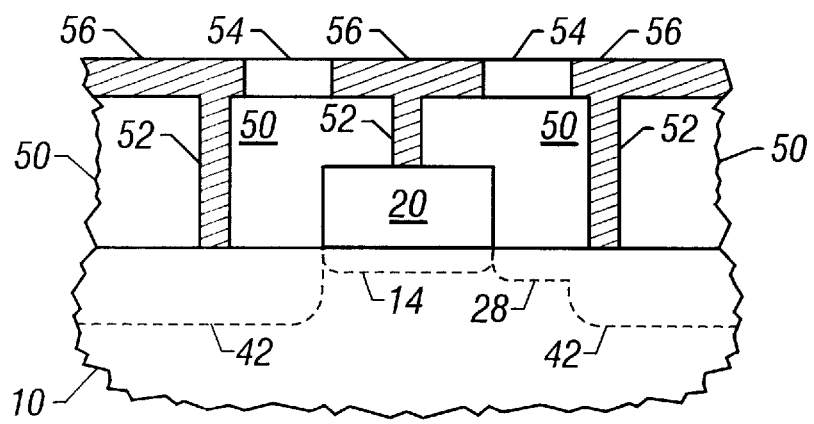

Referring to FIG. 2I, the result of a multiplicity of steps to couple the device to the remainder of the integrated circuit are illustrated. The spacer(s) 34 and the protective layer 30 can optionally be removed with a wet etch. A dielectric layer 50 is formed over the device. The dielectric layer is planarized and vias formed therein, the vias exposing the source/drain regions 42 in the substrate and exposing the gate electrode 20. At this point, steps can be taken to lower the contact resistance at the surface of the exposed regions. Typically, metals, such as cobalt or titanium, are reacted with the exposed surfaces at temperatures of 550° to 700° C. to form a salicide, e.g. $CoSi_2$ or $TiSi_2$. After removal of excess metal, the salicide can be exposed to a temperature of 600° C. to 800° C., a procedure that results in a phase-change of the salicide to a lower resistance state. The exposed surfaces of the source/drain regions 42, the exposed surface of the gate electrode 20 and the walls of the vias have a liner, for example, of titanium or titanium nitride, formed thereon. The vias are then filled with a conducting material, such as polysilicon or tungsten, to provide conducting vias 52. The conducting vias 52 are electrically coupled to conducting paths 56 formed, for example, of copper or aluminum in an insulating layer 54. The insulating layer 54 and the conducting paths 56 form the first interconnect layer. Interconnect layers provide the distribution of signals for the integrated circuit.

Figure 3A:
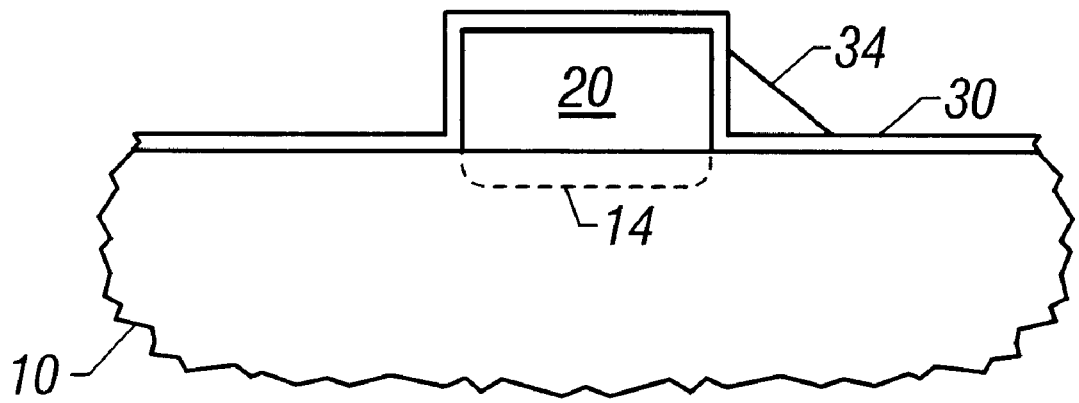
FIGS. 3A–3B illustrate the steps in fabricating an IGFET device with lightly-doped source/drain regions according to a second embodiment of the present invention.
Figure 3B:
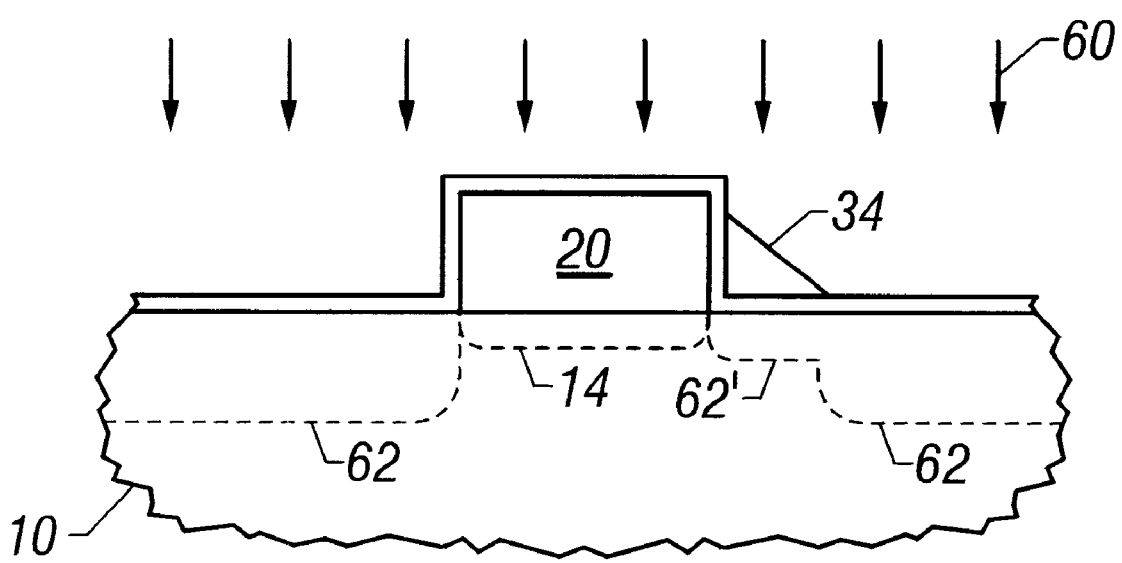

FIG. 3A and FIG. 3B illustrate a procedure for forming source/drain regions with a single ion implantation step. Referring to FIG. 3A, FIG. 2E is reproduced; however, the photoresist layer 36 has not been formed and the lightly-doped source/drain regions (i.e., 28 in FIG. 2E) have not been formed in the substrate, i.e., the ion implantation and associated steps of FIG. 2C have been omitted.

Referring to FIG. 3B, the ion implantation 60 for forming normally-doped source/drain regions 62 is shown However, the parameters of the spacers 34 have been chosen with different criteria. In the procedures illustrated by FIGS. 2A–2I, the spacer parameters were chosen so that during the ion implantation step shown in FIG. 2H, the ions implanted under the spacer would be essentially completely blocked proximate the channel region 14, and the prior-implanted lightly-doped regions would not be affected by this second ion implantation. In the ion implantation 60 illustrated by FIG. 3B, the spacer 34 must permit ions to be implanted of sufficient concentration that, after annealing, the source/drain region masked by the spacer 34 is electrically coupled to channel region by a lightly-doped region $62^1$. Expressed in a different manner, the spacer 34 provides an amount of attenuation in the region shadowed by spacer 34 that a lightly-doped source/drain sub-region $62^1$ results. However, the lightly-doped source/drain sub-region $62^1$ along with the normally-doped source/drain region 62, has been formed with a single ion implantation. Following FIG. 3B, the procedures described with respect to FIG. 2I will be implemented.

Those skilled in the art will readily implement the steps necessary to provide the structures and the methods disclosed herein, and will understand that the process parameters, materials, dimensions, and sequence of steps are given by way of example only and can be varied to achieve the desired structure as well as modifications that are within the scope of the invention. Variations and modifications of the embodiments disclosed herein may be made based on the description set forth herein, without departing from the spirit and scope of the invention as set forth in the following claims.

What is claimed is:

1. A method of fabricating an asymmetrical IGFET from a semiconductor device that comprises a substrate, a gate structure disposed on the substrate, a protective layer over the gate structure and at least a portion of the substrate, source/drain regions aligned by the gate structure, and a channel region beneath the gate structure, the method comprising the steps:

forming a pair of spacers abutting respective sides of the gate structure and covering portions of the protective layer;

etching portions of the spacers concurrently with portions of the protective layer not covered by the spacers;

applying a photoresist layer over only a first one of the spacers;

etching away the second one of the spacers;

removing the photoresist; and subjecting the semiconductor device to ion implantation so that asymmetrical source/drain regions are formed in the semiconductor device.

2. A method as defined in claim 1, wherein ion implantation is performed at an energy of 5 to 50 keV and with a concentration of $1\times10^{15}$ to $5\times10^{15}$ ions/cm$^2$.

3. A method of fabricating an asymmetrical IGFET from a semiconductor device as defined in claim 1, wherein (i) the semiconductor device comprises respective first and second lightly doped source/drain regions, (ii) upon etching away the second one of the spacers, the first lightly doped source/drain region is shadowed by a spacer and the second lightly doped source/drain region is not shadowed by a spacer, and (iii) the step of subjecting the device to ion implantation is performed so that the first source/drain region exhibits a normally doped portion and exhibits a lightly doped portion between the normally doped portion and the channel region.

4. A method of fabricating an asymmetrical IGFET from a semiconductor device as defined in claim 3, wherein the normally doped portion of the first source/drain region extends into the substrate a depth that is greater than the depth into the substrate that the lightly doped portion of the first source/drain region extends.

5. A method of fabricating an asymmetrical IGFET as defined in claim 4, wherein ion implantation is performed at an energy of 5 to 50 KeV and with a concentration of $1\times10^{15}$ to $5\times10^{15}$ ions/cm$^2$.

6. A method of fabricating an asymmetrical IGFET from a semiconductor device as defined in claim 4, wherein the spacers are deposited by high-density plasma deposition techniques.

7. A method of fabricating an asymmetrical IGFET from a semiconductor device as defined in claim 4, wherein the protective layer is silicon oxide.

8. A method of fabricating an asymmetrical IGFET from a semiconductor device that comprises a substrate, a gate structure on the substrate, a protective layer over the gate structure and at least a portion of the substrate, respective first and second source/drain regions aligned by the gate structure, and a channel region beneath the gate structure, the method comprising the steps:

forming a pair of triangular spacers abutting respective sides of the gate structure and covering portions of the protective layer;

performing a timed etch so as to remove portions of the protective layer not covered by the spacers, the timed etch performed for a duration that determines the size of at least one of the spacers;

applying a photoresist layer over only a first one of the spacers;

etching away the second one of the spacers;

removing the photoresist; and subjecting the semiconductor device to ion implantation so that asymmetrical source/drain regions are formed in the semiconductor device.

9. A method of fabricating an asymmetrical IGFET from a semiconductor device as defined in claim 8, wherein the ion implantation is performed at an energy of 5 to 50 keV and with a concentration of $1\times10^{15}$ to $5\times10^{15}$ ions/cm$^2$.

10. A method of fabricating an asymmetrical IGFET from a semiconductor device as defined in claim 9, wherein the step of subjecting the semiconductor device to ion implantation is performed so that the first source/drain region exhibits a first doped portion and exhibits a second doped portion between the first doped portion and the channel region.

11. A method of fabricating an asymmetrical IGFET from a semiconductor device as defined in claim 10, wherein the second doped portion is a lightly doped portion.

12. A method of fabricating an asymmetrical IGFET from a semiconductor device as defined in claim 10, wherein the first doped portion of the first source/drain region extends into the substrate a depth that is greater than the depth extended into the substrate by the second doped portion of the first source/drain region.

13. A method of fabricating an asymmetrical IGFET as defined in claim 12, wherein ion implantation is performed at an energy of 5 to 50 keV at a concentration of $1 \times 10^{15}$ to $5 \times 10^{15}$ ions/cm$^2$.

14. A method of fabricating an asymmetrical IGFET from a semiconductor device as defined in claim 12, wherein the spacers are deposited by high-density plasma deposition techniques.

15. A method of fabricating an asymmetrical IGFET from a semiconductor device as defined in claim 12, wherein the protective layer is silicon oxide.

16. An asymmetrical IGFET fabricated from a semiconductor device in accordance with the method of claim 12.

17. A method of fabricating an asymmetrical IGFET in a semiconductor device that comprises:
   (i) a substrate;
   (ii) a gate structure vertically disposed over at least a portion of the substrate, the gate structure exhibiting a first and a second sidewall;
   (iii) a protective layer over the gate structure and over at least a portion of the substrate;
   (iv) a first source/drain region and a second source/drain region, the first and the second source/drain regions respectively aligned with the first and the second sidewalls; and
   (v) a channel region beneath the gate structure between the first source/drain region and the second source/drain region, the method comprising the steps:
   (a) forming a first spacer abutting the first sidewall and a second spacer abutting the second sidewall;
   (b) etching portions of the first and the second spacers and portions of the protective layer not covered by the spacers;
   (c) applying a photoresist layer over the first spacer but not over the second spacer;
   (d) etching the second spacer so that at least a first portion of the first source/drain region is shadowed by the first spacer an the second source/drain region is not shadowed by a spacer;
   (e) removing the photoresist; and
   (f) subjecting the semiconductor device to ion implantation so that the first source/drain region and the second source/drain region are asymmetrical.

18. A method of fabricating an asymmetrical IGFET as defined in claim 17, wherein the semiconductor device is subjected to ion implantation so that the first portion of the first source/drain region extends into the substrate a depth that is greater than the depth extended into the substrate by a second portion of the first source/drain region.

19. An asymmetrical IGFET fabricated in accordance with the method of claim 18.

20. A method of fabricating an asymmetrical IGFET as defined in claim 17, wherein the spacers are formed through a high-density plasma deposition technique.

21. A method of fabricating an asymmetrical IGFET as defined in claim 20, wherein each of the spacers exhibits a cross-section that declines from a maximum height at a position abutting a respective sidewall.

22. A method of fabricating an asymmetrical IGFET as defined in claim 20, wherein in Step (b) the spacers are etched for a time duration that determines the size of the spacers.

23. A method of fabricating an asymmetrical IGFET, with a single ion-implantation step, from a semiconductor device that comprises a substrate, a gate structure comprising a first sidewall and a second sidewall and disposed on the substrate over a channel region, and a protective layer over the gate structure and at least a portion of the substrate, the method comprising the steps:
   forming a spacer abutting the second sidewall of the gate structure, wherein the spacer is formed prior to any preceding ion implantation in the semiconductor device and is formed to permit ion implantation into a substrate region shadowed by the spacer; and
   implanting ions into the device so that a first source drain region is formed in alignment with the first sidewall and a second source/drain region is formed in alignment with the second sidewall, the second source/drain region comprising a normally doped region and a lightly doped region, wherein the normally doped region is coupled to the channel region by the lightly doped region.

24. An asymmetrical IGFET fabricated in accordance with the method of claim 23.

* * * * *